United States Patent
Harada

(10) Patent No.: US 11,348,648 B2
(45) Date of Patent: May 31, 2022

(54) SEMICONDUCTOR MEMORY DEVICE

(71) Applicant: KIOXIA CORPORATION, Tokyo (JP)

(72) Inventor: Yoshikazu Harada, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 17 days.

(21) Appl. No.: 16/804,019

(22) Filed: Feb. 28, 2020

(65) Prior Publication Data

US 2021/0035646 A1 Feb. 4, 2021

(30) Foreign Application Priority Data

Jul. 29, 2019 (JP) .............................. JP2019-138727

(51) Int. Cl.
*G11C 16/10* (2006.01)
*G11C 16/26* (2006.01)
*G11C 16/14* (2006.01)
*G11C 16/04* (2006.01)

(52) U.S. Cl.
CPC .......... *G11C 16/26* (2013.01); *G11C 16/0483* (2013.01); *G11C 16/10* (2013.01); *G11C 16/14* (2013.01)

(58) Field of Classification Search
CPC ..... G11C 16/26; G11C 16/10; G11C 16/0483; G11C 16/14
See application file for complete search history.

(56) References Cited

U.S. PATENT DOCUMENTS

| | | | |
|---|---|---|---|
| 5,822,244 A | 10/1998 | Hansen et al. | |
| 5,937,424 A * | 8/1999 | Leak ...................... | G11C 16/10 365/185.11 |
| 7,164,610 B2 | 1/2007 | Kimura et al. | |
| 7,562,180 B2 * | 7/2009 | Gyl ....................... | G11C 7/1075 711/103 |
| 10,042,587 B1 * | 8/2018 | Pedersen .................. | G11C 7/20 |
| 10,249,377 B2 | 4/2019 | Kasai et al. | |
| 2012/0167100 A1 * | 6/2012 | Li .......................... | G11C 16/22 718/102 |
| 2012/0191961 A1 * | 7/2012 | Wu ........................ | G06F 1/3275 713/2 |
| 2015/0186042 A1 * | 7/2015 | Lee ........................ | G11C 16/10 711/103 |
| 2017/0262229 A1 | 9/2017 | Ochi et al. | |
| 2019/0220219 A1 * | 7/2019 | Um .......................... | G06F 3/0679 |
| 2020/0126625 A1 * | 4/2020 | Park ....................... | G11C 16/10 |
| 2020/0161320 A1 * | 5/2020 | Yamaguchi ............ | G11C 16/26 |

* cited by examiner

*Primary Examiner* — Khamdan N. Alrobaie
(74) *Attorney, Agent, or Firm* — Holtz, Holtz & Volek PC

(57) ABSTRACT

According to an embodiment, a semiconductor memory device includes a memory cell array and a control circuit. The control circuit is configured to suspend a first operation on the memory cell array while the first operation is being performed, to start a first read operation on the memory cell array, and to resume the suspended first operation at least after the first read operation has been started. Upon receipt of a first command, a setting as to whether or not to resume the suspended first operation in response to receipt of a second command is switched. The second command is different from the first command.

11 Claims, 9 Drawing Sheets

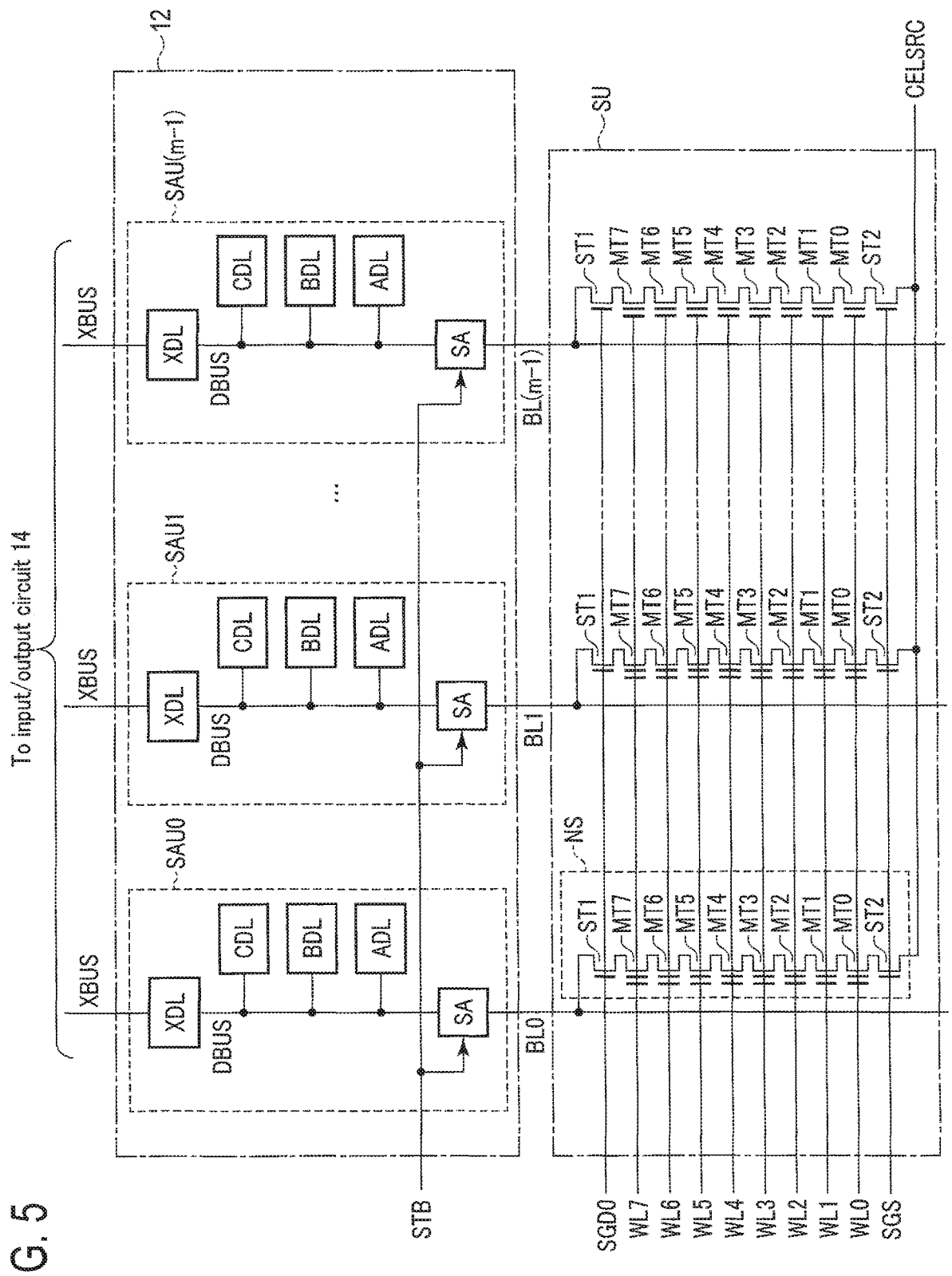
F I G. 5

SEMICONDUCTOR MEMORY DEVICE

CROSS-REFERENCE TO RELATED APPLICATIONS

This application is based upon and claims the benefit of priority from Japanese Patent Application No. 2019-138727, filed Jul. 29, 2019, the entire contents of which are incorporated herein by reference.

FIELD

Embodiments described herein relate generally to a semiconductor memory device.

BACKGROUND

A NAND-type flash memory is known as a semiconductor memory device.

BRIEF DESCRIPTION OF THE DRAWINGS

FIG. 5 is a block diagram illustrating an example of a configuration of a sense amplifier module in the semiconductor memory device according to the first embodiment.

DETAILED DESCRIPTION

In general, according to an embodiment, semiconductor memory device includes a memory cell array and a control circuit. The control circuit is configured to suspend a first operation on the memory cell array while the first operation is being performed, to start a first read operation on the memory cell array, and to resume the suspended first operation at least after the first read operation has been started. Upon receipt of a first command, a setting as to whether or not to resume the suspended first operation in response to receipt of a second command is switched. The second command is different from the first command.

Embodiments will be described with reference to the accompanying drawings. In the description that follows, components having the same functions and configurations will be denoted by common reference symbols. When multiple components with a common reference symbol need to be distinguished from one another, suffixes are added to the common reference symbol to make such distinctions. When multiple components need not be particularly distinguished from one another, the multiple components are denoted only by the common reference symbol, without the addition of a suffix.

First Embodiment

Hereinafter, a semiconductor memory device according to a first embodiment will be described.

Configuration Example (1) Memory System

Figure 1:
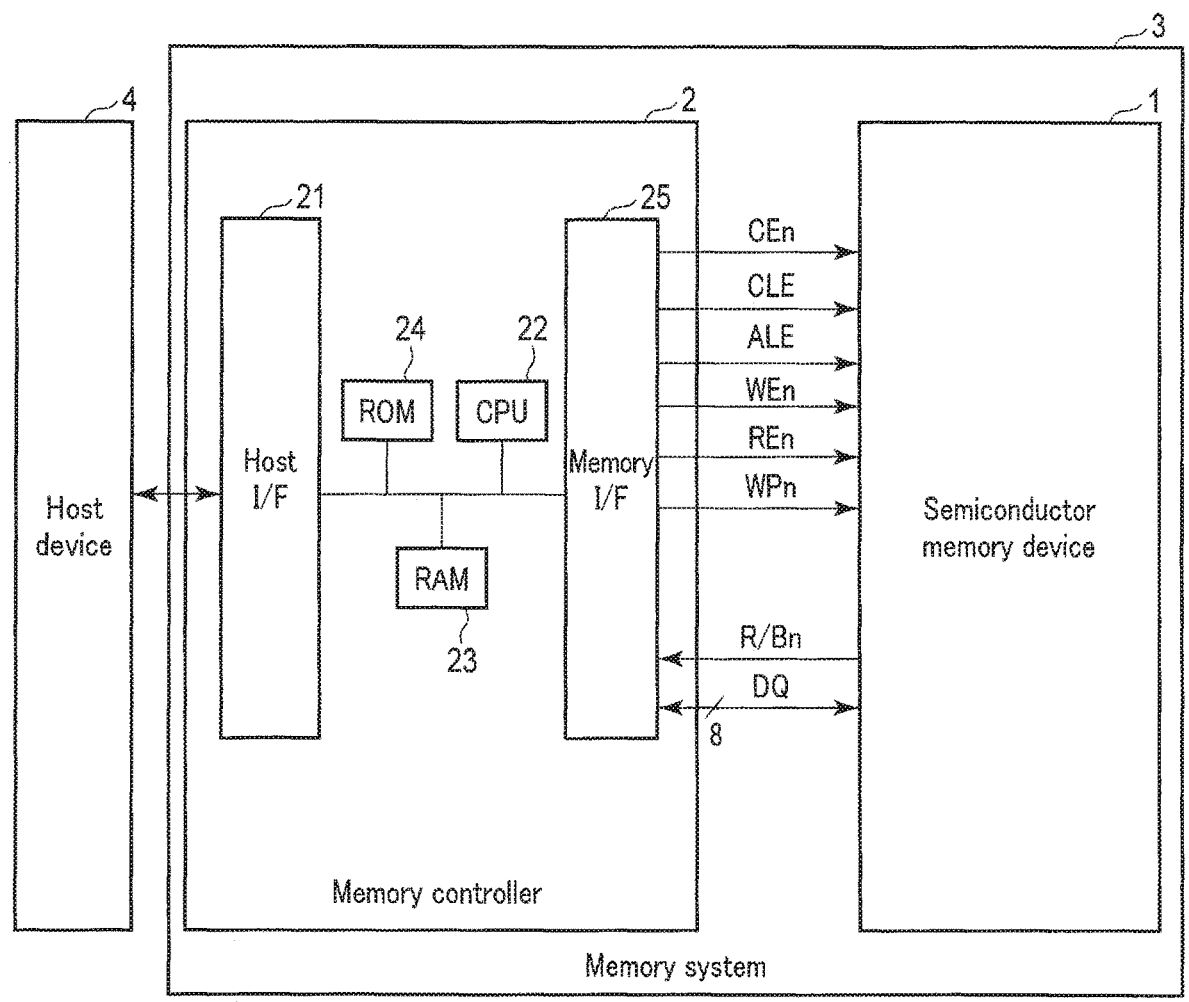
FIG. 1 is a block diagram illustrating an example of a configuration of a memory system including semiconductor memory device according to a first embodiment.

FIG. 1 is a block diagram illustrating an example of a configuration of a memory system 3 including a semiconductor memory device 1 according to the first embodiment.

As shown in FIG. 1, the memory system 3 includes a memory controller 2, as well as the semiconductor memory device 1, and is controlled by a host device 4. The memory system 3 is, for example, a solid-state drive (SSD), an SD (registered trademark) card, etc.

The semiconductor memory device 1 is controlled by the memory controller 2. The memory controller 2 receives an instruction from the host device 4, and controls the semiconductor memory device 1 based on the received instruction.

The memory controller 2 includes a host interface circuit 21, a central processing unit (CPU) 22, a random-access memory (RAM) 23, a read-only memory (ROM) 24, and a memory interface circuit 25. The memory controller 2 is configured as, for example, a system on a chip (SoC).

The ROM 24 stores firmware (programs). The RAM 23 is capable of storing the firmware, and is used as a working area by the CPU 22. Furthermore, the RAM 23 temporarily stores data, and functions as a buffer and cache. The firmware stored in the ROM 24 and loaded onto the RAM 23 is executed by the CPU 22. This allows the memory controller 2 to execute various operations, including write and read operations, to be described later, as well as some of the functions of the host interface circuit 21 and the memory interface circuit 25.

The host interface circuit 21 is coupled to the host device 4 via a bus, and manages communications between the memory controller 2 and the host device 4. For example, the host interface circuit 21 receives an instruction from the host device 4. The memory interface circuit is coupled to the semiconductor memory device 1 via a memory bus, and manages communications between the memory controller 2 and the semiconductor memory device 1. For example, the memory interface circuit 25 issues, based on an instruction from the host device 4, a command sequence including a command and address information, and transmits the command sequence to the semiconductor memory device 1. The memory bus transfers, for example, a chip enable signal CEn, a command latch enable signal CLE, an address latch enable signal ALE, a write enable signal WEn, a read enable signal REn, a write protect signal WPn, ready/busy signal R/Bn, and signals DQ.

(2) Semiconductor Memory Device

Figure 2:
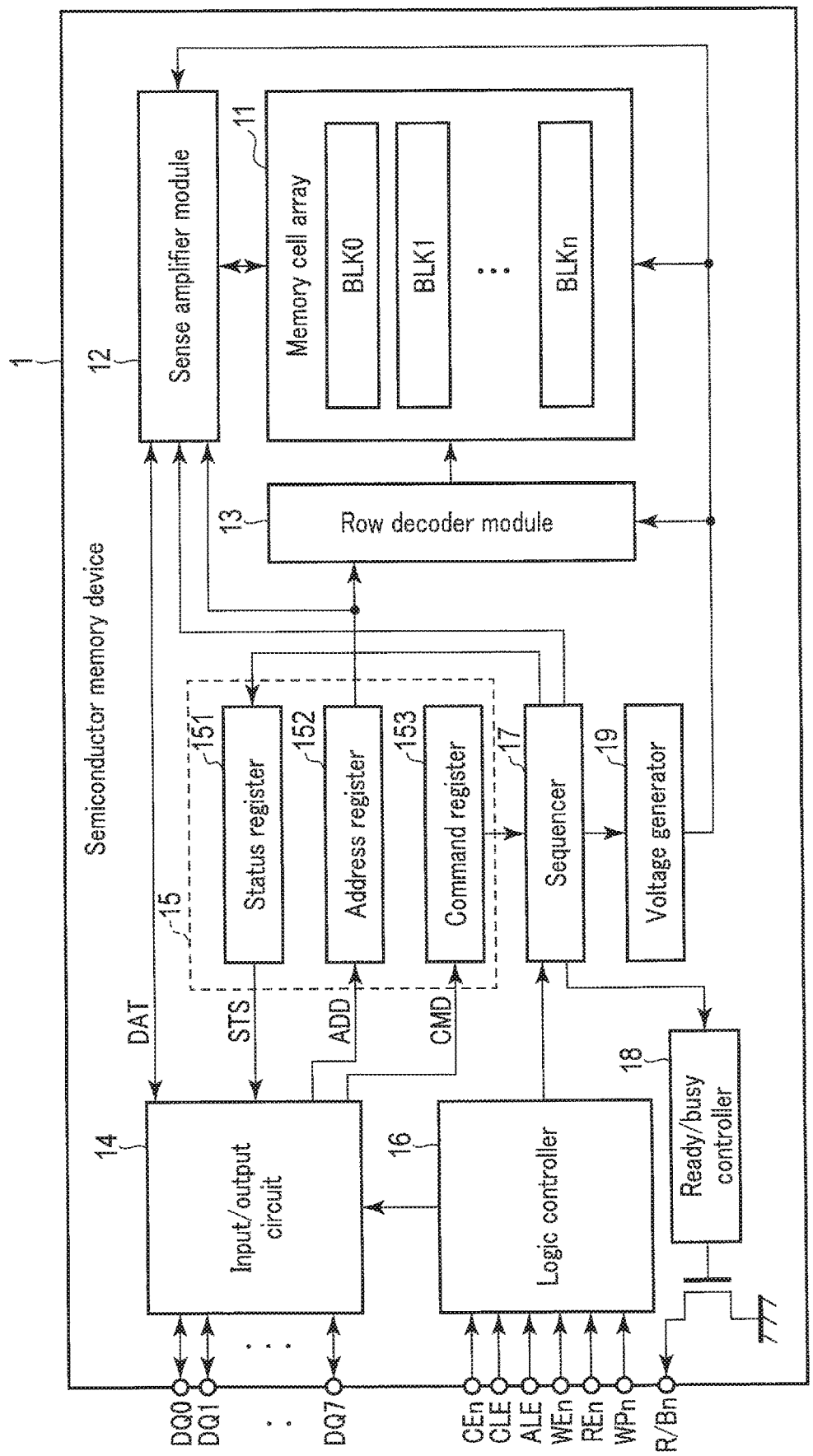
FIG. 2 is a block diagram illustrating an example of a configuration of the semiconductor memory device according to the first embodiment.

FIG. 2 is a block diagram illustrating an example of a configuration of the semiconductor memory device 1 according to the first embodiment. The semiconductor memory device 1 according to the first embodiment is, for example, a NAND-type flash memory capable of storing data in a non-volatile manner.

As shown in FIG. 2, the semiconductor memory device 1 includes a memory cell array 11, a sense amplifier module 12, a row decoder module 13, an input/output circuit 14, a register 15, a logic controller 16, a sequencer 17, a ready/busy controller 18, and a voltage generator 19. In the semiconductor memory device 1, various operations are performed, such as a write operation in which write data DAT is stored in the memory cell array 11, a read operation in which read data DAT is read from the memory cell array 11, etc.

The memory cell array 11 includes a plurality of blocks BLK0 to BLKn (where "n" is an integer equal to or greater than 1). Each block BLK includes a plurality of non-volatile memory cells each associated with a bit line and a word line, and constitutes, for example, a unit of data erasure. Either a single-level cell (SLC) device or a multi-level cell (MLC) device, for example, may be adopted as the semiconductor memory device 1. An SLC device stores 1-bit data in each memory cell, while an MLC device stores 2-bit data in each memory cell. Each memory cell may be configured to store three or more bits of data.

The input/output circuit 14 controls input and output of signals DQ to and from the memory controller 2. The signals DQ include a command CMD, data DAT, address information ADD, status information, STS, etc. The command CMD includes, for example, an instruction to execute an instruction from the host device 4. The data DAT includes write data DAT or read data DAT. The address information ADD includes, for example, a column address and a row address. The status information STS includes, for example, information on the status of the semiconductor memory device 1 regarding write and read operations.

More specifically, the input/output circuit 14 includes an input circuit and an output circuit, which perform processes that will be described below. The input circuit receives, from the memory controller 2, write data DAT, address information ADD, and a command CMD. The input circuit transfers the received write data DAT to the sense amplifier module 12, and transfers the received address information ADD and the command CMD to the register 15. The output circuit receives status information STS from the register 15, and receives read data DAT from the sense amplifier module 12. The output circuit transmits the received status information STS and the read data DAT to the memory controller 2. The input/output circuit 14 and the sense amplifier module 12 are coupled via a data bus. The data bus includes, for example, eight data lines IO0 to IO7, respectively corresponding to the signals DQ0 to DQ7. The number of data lines IO is not limited to eight, and may be set to, for example, 16 or 32, or any other number.

The register 15 includes a status register 151, an address register 152, and a command register 153.

The status register 151 stores status information STS, and transfers the status information STS to the input/output circuit 14 based on an instruction from the sequencer 17.

The address register 152 stores address information ADD transferred from the input/output circuit 14, and transfers the address information ADD to the sequencer 17. The address register 152 transfers a column address in the address information ADD to the sense amplifier module 12, and transfers a row address in the address information ADD to the row decoder module 13.

The command register 153 stores a command CMD transferred from the input/output circuit 14, and transfers the command CMD to the sequencer 17.

The logic controller 16 receives, from the memory controller 2, for example, a chip enable signal CEn, a command latch enable signal CLE, an address latch enable signal ALE, a write enable signal WEn, a read enable signal REn, and a write protect signal WPn. Based on the received signal, the logic controller 16 controls the input/output circuit 14 and the sequencer 17.

The chip enable signal CEn is a signal used to enable the semiconductor memory device 1. The command latch enable signal CLE is signal used to notify the input/output circuit 14 that the signals DQ input to the semiconductor memory device 1 serve as a command CMD. The address latch enable signal ALE is a signal used to notify the input/output circuit 14 that the signals DQ input to the semiconductor memory device 1 serve as address information ADD. The write enable signal WEn and the read enable signal REn are signals used to instruct the input/output circuit 14 to respectively input and output signals DQ. The write protect signal WPn is a signal used to instruct the semiconductor memory device 1 to prohibit data from being written or erased.

The sequencer 17 receives a command CMD and address information ADD, and controls the operation of the entire semiconductor memory device 1 in accordance with the received command CMD and address information ADD. The sequencer 17 controls, for example, the sense amplifier module 12, the row decoder module 13, the voltage generator 19, etc., to perform various operations, such as write and read operations.

The ready/busy controller 18 generates a ready/busy signal R/Bn in accordance with the control by the sequencer 17, and transmits the generated ready/busy signal R/Bn to the memory controller 2. The ready/busy signal R/Bn is a signal used to make a notification as to whether the semiconductor memory device 1 is in a ready state in which the semiconductor memory device 1 is ready to receive an instruction from the memory controller 2, or in a busy state in which the semiconductor memory device 1 is not ready to receive an instruction.

The voltage generator 19 generates voltages based on the control by the sequencer 17, and supplies the generated voltages to the memory cell array 11, the sense amplifier module 12, the row decoder module 13, etc. The voltage generator 19 generates voltages to be applied to, for example, word lines, to be described later, in operations such as read and write operations. The voltage generator 19 supplies the row decoder module 13 with the generated voltages to be applied to the word lines.

The sense amplifier module 12 receives a column address from the address register 152, and decodes the received column address. The sense amplifier module 12 performs an operation to transfer data DAT between the memory controller 2 and the memory cell array 11, as will be described below, based on the result of the decoding. That is, the sense amplifier module 12 senses threshold voltages of memory cell transistors in the memory cell array 11 to generate read data DAT, and outputs the generated read data DAT to the memory controller via the input/output circuit 14. The sense amplifier module 12 receives the write data DAT from the memory controller 2 via the input/output circuit 14, and transfers the received write data DAT to the memory cell array 11.

The row decoder module 13 receives a row address from he address register 152, and decodes the received row address. The row decoder module 13 selects a block BLK to be a target of various operations, such as read and write operations, based on the result of decoding. The row decoder module 13 is capable of transferring voltages supplied from the voltage generator 19 to the selected block BLK.

(3) Memory Cell Array

Figure 3:
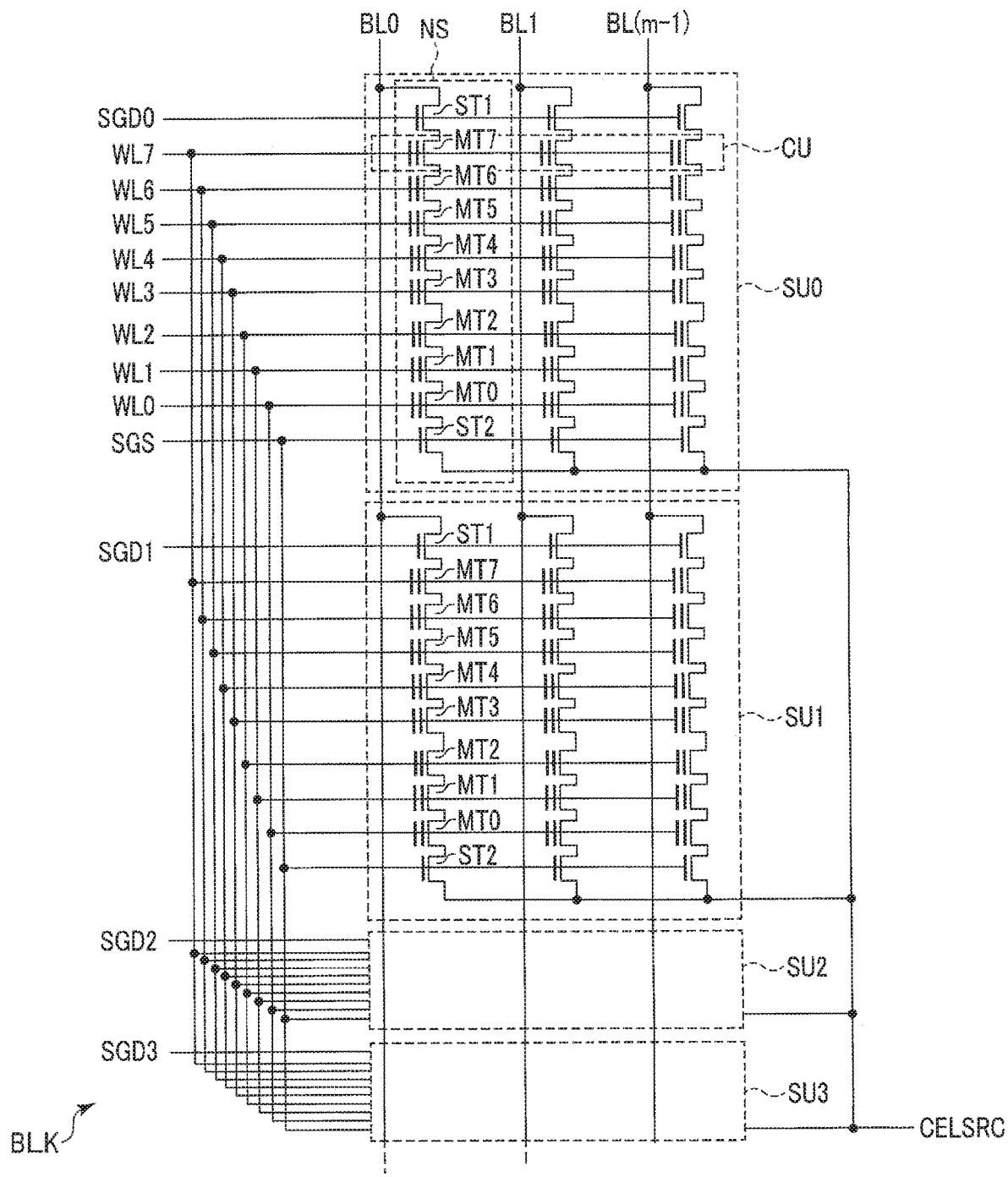
FIG. 3 illustrates an example of a circuit configuration of a memory cell array in the semiconductor memory device according to the first embodiment.

FIG. 3 illustrates an example of a circuit configuration of a memory cell array 11 in the semiconductor memory device 1 according to the first embodiment. In FIG. 3, an example of a circuit configuration of one of a plurality of blocks BLK included in the memory cell array 11 is shown, as an example of circuit configuration of the memory cell array 11. For example, each of the blocks BLK included in the memory cell array 11 has the circuit configuration shown in FIG. 3.

As shown in FIG. 3, each block BLK includes, for example, four string units SU0 to SU3. Each of the string units SU includes a plurality of NAND strings NS. Each NAND string NS is coupled to a corresponding bit line BL, of a plurality of bit lines BL0 to BL(m−1) (where "m" is an integer equal to or greater than 1), and includes, for example, memory cell transistors MT0 to MT7 and select transistors ST1 and ST2. Each of the memory cell transistors MT includes a control gate (hereinafter also referred to as a "gate") and a charge storage layer, and stores data in a non-volatile manner. The select transistors ST1 and ST2 are used in various operations to select the NAND string NS including the select transistors ST1 and ST2.

A drain of the select transistor ST1 of each of the NAND strings NS is coupled to the corresponding bit line BL. The memory cell transistors MT0 to MT7 are coupled in series between a source of the select transistor ST1 and a drain of the select transistor ST2. A source of the select transistor ST2 is coupled to a source line CELSRC.

Gates of select transistors ST1 of a plurality of NAND strings NS included in the same string unit SUj are commonly coupled to a select gate line SGDj. In the example of FIG. 3, "j" is an integer from 0 to 3. Gates of select transistors ST2 of a plurality of NAND strings NS included in the same block BLK are commonly coupled to a select gate line SGS. Gates of memory cell transistors MTk of a plurality of NAND strings NS included in the same block BLK are commonly coupled to a word line WLk. In the example of FIG. 3, "k" is an integer from 0 to 7.

Each bit line BL is commonly coupled to the drains of select transistors ST1 of the respective NAND strings NS included in a plurality of string units SU. The source line CELSRC is shared among the string units SU.

A group of memory cell transistors MT commonly coupled to a word line WL in a string unit SU is referred to as, for example, a "cell unit CU". Data consisting of same-order single bits stored in the respective memory cell transistors MT in a cell unit CU is referred to as, for example, "1-page data".

The circuit configuration of the memory cell array 11 has been described as above; however, the circuit configuration of the memory cell array 11 is not limited thereto. For example, the number of string units SU included in each block BLK may be designed to be any number. Also, each of the numbers of memory cell transistors MT and select transistors ST1 and ST2 included in each NAND string NS may be designed to be any number. The numbers of word lines WL and select gate lines SGD and SGS may be changed based on the numbers of memory cell transistors MT and select transistors ST1 and ST2 in the NAND string NS.

(4) Threshold Voltage Distributions of Memory Cell Transistors

Figure 4:
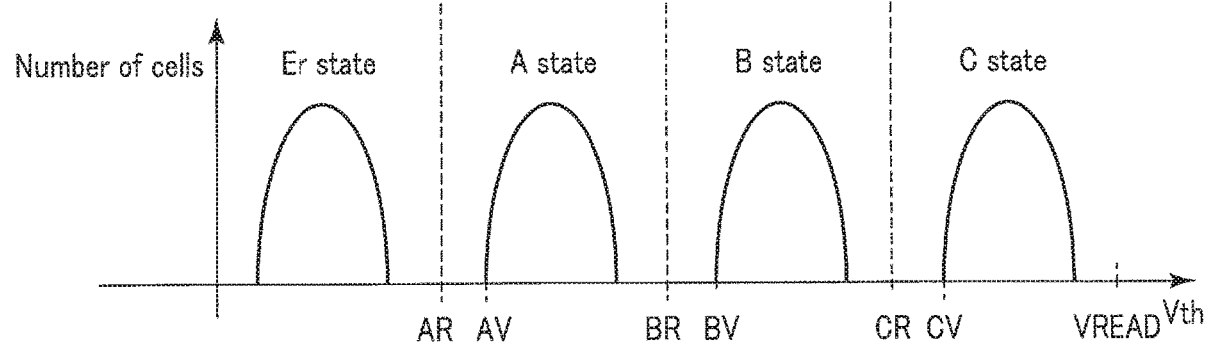
FIG. 4 illustrates an example of threshold voltage distributions formed by memory cell transistors of the semiconductor memory device according to the first embodiment.

FIG. 4 illustrates an example of threshold voltage distributions, data allocation, read voltages, and verify voltages when a memory cell transistor MT in the memory cell array 11 shown in FIG. 3 stores 2-bit data. In the description that follows, a memory cell transistor MT as a write or read target will be referred to as a "select memory cell transistor MT".

A memory cell transistor MT stores the 2-bit data based on the minimum gate-source potential difference (hereinafter referred to as a "threshold voltage") that enables the memory cell transistor MT to switched from the off state to the on state. In a write operation, a program operation is performed, in which electrons are injected into a charge storage layer of a select memory cell transistor MT, thereby increasing the threshold voltage of the select memory cell transistor MT.

FIG. 4 illustrates four threshold voltage distributions formed as a result of the above-described threshold voltage control. In the threshold voltage distributions shown in FIG. 4, the vertical axis represents the number of memory cell transistors MT, and the horizontal axis represents the threshold voltage Vth of each of the memory cell transistors MT. As an example, the horizontal axis indicates the lowest possible voltage to be applied to a gate of a memory cell transistor MT to switch the memory cell transistor MT from the off state to the on state when, for example, a reference voltage is applied to a source of the memory cell transistor MT.

For example, each memory cell transistor MT is determined as belonging to one of the "Er state", "A state", "B state", or "C state", according to which of the four threshold voltage distributions the threshold voltage of the memory cell transistor MT falls in. The threshold voltages of the memory cell transistors MT increase in the order of the memory cell transistor MT in the Er state, A state, B state, and C state. For example, data "11" (respectively representing the lower bit and the upper bit) is assigned to the Er state, data "01" is assigned to the A state, data "00" is assigned to the B state, and data "10" is assigned to the C state. The data allocated to each state is the data stored in a memory cell transistor MT in that state.

In a write operation, a verify operation is performed in which whether or not the threshold voltage of the select memory cell transistor MT has exceeded a predetermined voltage is verified. A verify voltage to be used in a verify operation is set. Specifically, a verify voltage AV is set for the A state, a verify voltage BV is set for the B state, and a verify voltage CV is set for the C state.

For example, when the verify voltage AV is applied, a memory cell transistor MT that is turned on turns out to be in the Er state, and a memory cell transistor MT that is OFF turns out to be in the A state or higher-voltage states. It is thereby possible to confirm, as a result of a write operation of the data "01", for example, whether or not the threshold voltage of the memory cell transistor MT, which is the write target, is included in the threshold voltage distribution of the A state or higher-voltage states. The other verify voltages BV and CV are set in a similar manner.

In a read operation, it is determined which of the testes each memory cell transistor MT belongs to. A read voltage to be used in a read operation is set. Specifically, a read voltage AR is set for the A state, a read voltage BR is set for the B state, and a read voltage CR is set for the C state.

For example, when the read voltage AR is applied, a memory cell transistor MT that is turned on turns out to be in the Er state, and a memory cell transistor MT that is OFF turns out to be in the A state or higher-voltage states. It is thereby possible to determine whether the memory cell transistor MT is in the Er state or in the A state or higher-voltage states. The other read voltages BR and CR are set in a similar manner.

When a read operation is performed, some of the electrons stored in the charge storage layer of a memory cell transistor MT may leak from the charge storage layer with the passage of time, causing a drop in the threshold voltage of the memory cell transistor MT. To cope with such a drop in the threshold voltage, each read voltage is set to be lower than the corresponding verify voltage. That is, the read voltage AR is lower than the verify voltage AV, the read voltage BR is lower than the verify voltage BV, and the read voltage CR is lower than the verify voltage CV.

Moreover, a read pass voltage VREAD is set to always be higher than the threshold voltages of the memory cell transistors MT in the C state, which is the highest-voltage state. When the read pass voltage VREAD is applied to a gate of a memory cell transistor MT, the memory cell transistor MT is turned on, regardless of the data to be stored therein.

The number of bits of data stored in a memory cell transistor MT and the allocation of data to the threshold voltage distributions have been described above merely as an example, and are not limited thereto.

(5) Sense Amplifier Module

FIG. 5 is a block diagram illustrating an example of a configuration of a sense amplifier module 12 in the semiconductor memory device 1 according to the first embodiment. The configuration of the sense amplifier module 12, to be described in detail below, is merely an example, and various configurations may be adopted as the sense amplifier module 12.

As shown in FIG. 5, the sense amplifier module 12 includes, for example, m sense amplifier units SAU0 to SAU(m−1) provided for the respective bit lines BL.

Each sense amplifier unit SAU includes, for example, a sense amplifier circuit SA and latch circuits ADL, BDL, CDL, and XDL. The number of latch circuits included in each sense amplifier unit SAU is based on, for example, the number of bits of data stored in each memory cell transistor MT.

The sense amplifier circuit SA is coupled to a corresponding bit line BL. The sense amplifier circuit SA and the latch circuits ADL, BDL, CDL, and XDL are coupled to each other via a bus DBUS, in such a manner that data can be transmitted and received therebetween.

In a read operation, the sense amplifier circuit SA reads data by sensing the threshold voltage of the select memory cell transistor MT based on the current flowing through the corresponding bit line BL or the potential of the corresponding bit line BL. In a write operation, the sense amplifier circuit SA applies a voltage to the corresponding bit line BL. That is, the sense amplifier circuit SA directly controls the corresponding bit line BL. In a read operation, a control signal STB is supplied to the sense amplifier circuit SA from, for example, the sequencer 17. The sense amplifier circuit SA determines the read data at the timing at which the control signal STB is asserted, and the read data is transferred to, for example, one of the latch circuits ADL, BDL, CDL, or XDL.

The latch circuits ADL, BDL, and CDL temporarily store the read data and the write data.

The latch circuit XDL allows data to be transmitted and received between the corresponding sense amplifier unit SAU and the input/output circuit 14. That is, each bit of data received from, for example, the memory controller 2 is stored in a corresponding latch circuit XDL, and then transferred to one of latch circuits ADL, BDL, or CDL, or the sense amplifier circuit SA. Similarly, each bit of data in one of latch circuits ADL, BDL, or CDL, or the sense amplifier circuit SA, is transferred to a corresponding latch circuit XDL and stored therein, is subsequently transferred to the input/output circuit 14, and then output to the outside of the semiconductor memory device 1.

In this manner, the latch circuit XDL, coupled in series between the input/output circuit 14 and the sense amplifier circuit SA, functions as a cache memory of the semiconductor memory device 1. Accordingly, if latch circuits XDL are not storing data (i.e., unoccupied), the semiconductor memory device 1 can go into a ready state even if other latch circuits are storing data.

Operation Examples

Hereinafter, several operation examples of the semiconductor memory device 1 according to the first embodiment will be described in detail, in which an ongoing write operation (a write operation being performed) is suspended, a read operation is performed, and the suspended write operation is resumed after completion of the read operation. A read operation performed in this manner will also be referred to as a "suspend read operation".

A case will be described where a write operation is performed as the operation to be suspended; however, the present embodiment is not limited thereto. For example, the operation to be suspended may be an erase operation.

For convenience in explanation, a case will be described, as an example, where a cache program operation is performed as a write operation. In a cache program operation, a ready/busy signal R/Bn is set to a low (L) level (busy state) until write data input to latch circuits XDL is transferred to other latch circuits (e.g., latch circuits ADL), but is set to a high level (H) (ready state) after the transfer. However, the present embodiment is not limited thereto. As a write operation, a write operation to keep the semiconductor memory device 1 in the busy state even after the write data input to latch circuits XDL is transferred to other latch circuits may also be adopted.

Hereinafter, a case will be described where the semiconductor memory device 1 is configured in such a manner that an ongoing write operation is suspended without the need for a suspension command; however, the present embodiment is not limited thereto. For example, the semiconductor memory device 1 may be configured in such a manner that an ongoing write operation is suspended in response to a suspension command.

Regarding resumption of the suspended write operation, the semiconductor memory device 1 may be set to one of the following two modes: The first mode is a mode in which the write operation is resumed without the need for a resume command such as a command "48h" (hereinafter also referred to as "automatically resumed"). For convenience in explanation, such a mode will be hereinafter referred to as "auto-resume mode". On the other hand, the second mode is a mode in which the write operation is resumed in response to, for example, the resume command (hereinafter also referred to as "manually resumed"). For convenience in explanation, such a mode will be hereinafter referred to as "manual-resume mode".

The semiconductor memory device 1 is capable of switching between the two modes in the course of the processing by changing the settings. An operation example in which the semiconductor memory device 1 set to "auto-resume mode" throughout the processing and an operation example in which the semiconductor memory device 1 is set to "manual-resume mode" throughout the processing will be described. Next, operation examples will be described in which the semiconductor memory device 1 operates with a change in settings between the auto-resume mode and the manual-resume mode.

(1) Operation Example in Auto-Resume Mode

Figure 6A:
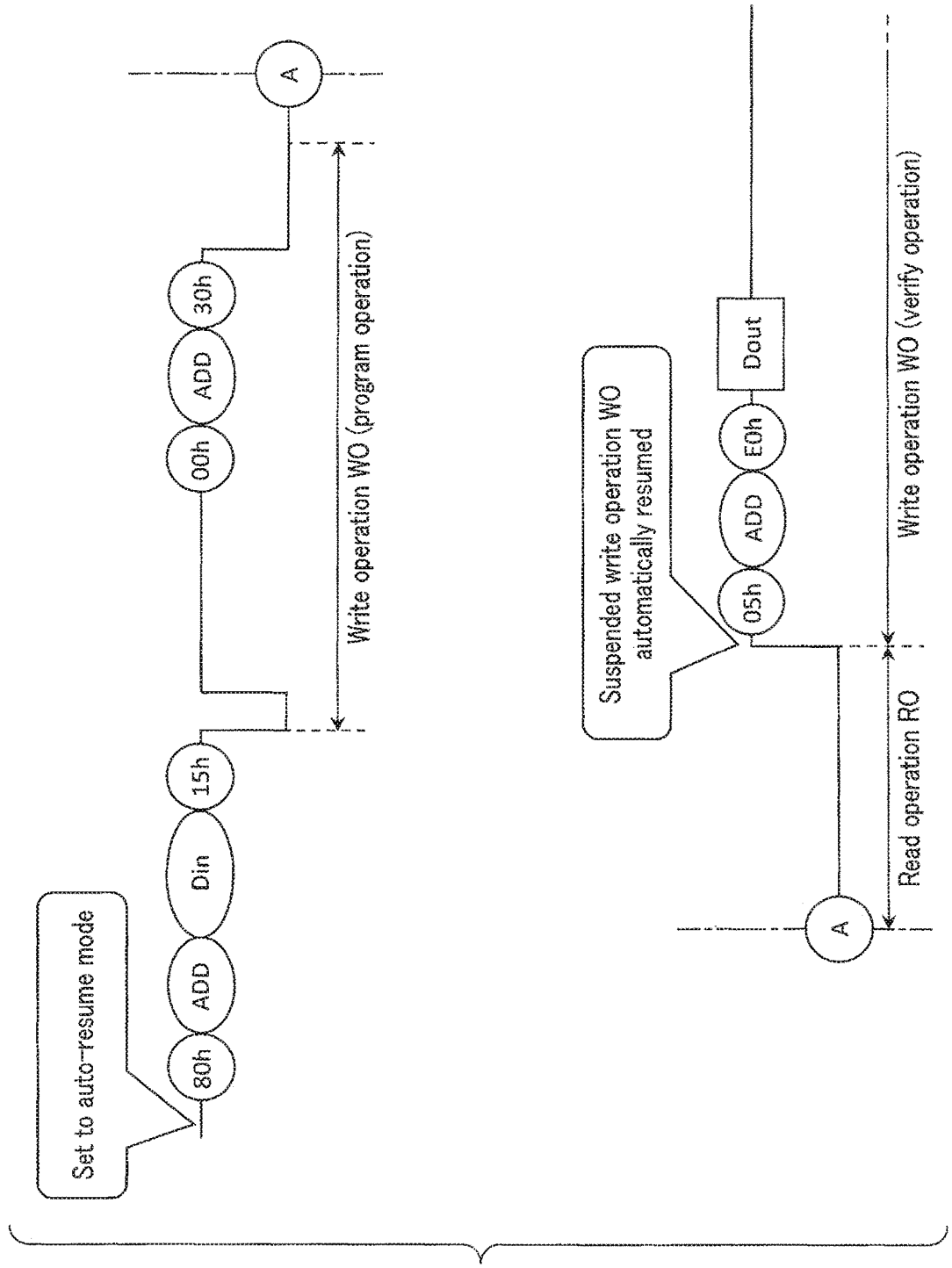
FIG. 6A illustrates an example of a timing chart showing command sequences and a ready/busy signal relating to a suspend read operation performed in the semiconductor memory device according to the first embodiment.

FIG. 6A illustrates an example of a timing chart showing command sequences and a ready/busy signal R/Bn relating to a suspend read operation performed in the semiconductor memory device 1 according to the first embodiment. In the example of FIG. 6A, the semiconductor memory device 1 is set to the auto-resume mode. In the description that follows, the write data DAT and the read data DAT described with reference to FIG. 2 will be respectively referred to as write data Din and read data Dout, for easy reference.

When the semiconductor memory device 1 is in the ready state, the memory controller 2 issues a command "80h" and transmits it to the semiconductor memory device 1. The command "80h" is a command used to instruct the semiconductor memory device 1 to perform a write operation.

The memory controller 2 issues address information ADD over, for example, five cycles, and transmits the address information ADD to the semiconductor memory device 1. The address information ADD, issued over five cycles, specifies, for example, a block BLK to be a write target, as well as an area in the block BLK. Based on the address information ADD, the sequencer 17 specifies an area in the memory cell array 11 in which data is to be written. The address information ADD need not be issued over five cycles, and may be issued over any number of cycles.

Subsequently, the memory controller 2 transmits write data Din to the semiconductor memory device 1. The sequencer 17 inputs each bit of the data Din to a latch circuit XDL corresponding to the area in the memory cell array 11 in which data is to be written.

Moreover, the memory controller 2 issues a command "15h" and transmits it to the semiconductor memory device 1. The command "15h" is a command used to cause the semiconductor memory device 1 to perform a cache program operation as a write operation, based on the address information ADD and the data Din, received subsequent to the receipt of the command "80h".

In response to receipt of the command "15h", the sequencer 17 causes the ready/busy controller 18 to transmit the ready/busy signal R/Bn to the memory controller 2 at the L level. Thereby, the memory controller 2 is notified that the semiconductor memory device 1 is in the busy state. The sequencer 17 controls the voltage generator 19, the sense amplifier module 12, the row decoder module 13, etc., to start a write operation WO. Thereafter, the sequencer 17 moves each bit of the data Din from the corresponding latch circuit XDL to another latch circuit (e.g., the latch circuit ADL). Thereby, the latch circuits XDL become unoccupied, and the sequencer 17 causes the ready/busy controller 18 to transmit the ready/busy signal R/Bn to the memory controller 2 at the H level. Thereby, the memory controller 2 is notified that the semiconductor memory device 1 is in the ready state.

While the write operation WO is being performed by the semiconductor memory device 1, the memory controller 2 receives, for example, an instruction from the host device 4 to perform a read operation with a high priority.

The memory controller 2 issues a command "00h" and transmits it to the semiconductor memory device 1. The command "00h" is a command used to instruct the semiconductor memory device 1 to perform a read operation. The memory controller 2 issues address information ADD over, for example, five cycles, and transmits the address information ADD to the semiconductor memory device 1. The address information ADD, issued over five cycles, specifies, for example, a block BLK to be a read target, as well as an area in the block BLK. Moreover, the memory controller 2 issues a command "30h" and transmits it to the semiconductor memory device 1. The command "30h" is a command used to cause the semiconductor memory device 1 to perform a read operation, based on the address information. ADD received subsequent to the receipt of the command "00h". Thereby, the sequencer 17 causes the ongoing write operation to be suspended at the timing at which, for example, a program operation has been completed, and thereafter starts a read operation.

In response to receipt of the command "30h", the sequencer 17 causes the ready/busy controller 18 to transmit the ready/busy signal R/Bn to the memory controller 2 at the L level. Thereby, the memory controller 2 is notified that the semiconductor memory device 1 is in the busy state. The sequencer 17 causes the ongoing write operation WO to be suspended, and switches the settings to start a read operation. Thereafter, the sequencer 17 starts a read operation RO. It is assumed that the read operation RO in the description that follows includes an operation to transfer each bit of data read from the memory cell array 11 to a corresponding latch circuit XDL, but does not include an operation to output each bit of the data from the corresponding latch circuit XDL to the memory controller 2.

After completion of the read operation RO, the sequencer 17 causes the ready/busy controller 18 to transmit the ready/busy signal R/Bn to the memory controller 2 at the H level. Thereby, the memory controller 2 is notified that the semiconductor memory device 1 is in the ready state. The memory controller 2 issues a command "05h", address information ADD, and a command "05h.", and transmits them to the semiconductor memory device 1. The commands "05h" and "E0h" are commands used to cause the semiconductor memory device 1 to output read data Dout read through the read operation (and transferred to the latch circuits XDL) to the memory controller 2. In response to receipt of the command "E0h", the sequencer 17 causes the data Dout read through the read operation RO to be output to the memory controller 2. The command "05h", the address information ADD, and the command "E0h" need not necessarily be issued. In this case, the semiconductor memory device 1 may output the data Dout to the memory controller 2, triggered by, for example, toggles of the read enable signal REn. The same applies to the other operation examples described below.

In accordance with the completion of the read operation RO, the sequencer 17 automatically resumes the suspended write operation WO. The resumption is made possible since, for example, an operation to access the memory cell array 11 is not performed after the operation to transfer each bit of the data Dout from the memory cell array 11 to the corresponding latch circuit XDL. In the resumed write operation WO, for example, a verify operation for the previously-completed program operation is performed. When the write operation WO is suspended, the suspension information is stored in, for example, a register in the sequencer, and the sequencer 17 resumes the write operation WO based on the suspension information stored in the register.

In this manner, the semiconductor memory device 1 set to the auto-resume mode automatically resumes the suspended write operation in accordance with the completion of the suspend read operation. The semiconductor memory device 1 performs the resumed write operation, for example, in parallel with the output of data read through the suspend read operation.

(2) Operation Example in Manual-Resume Mode

Figure 6B:
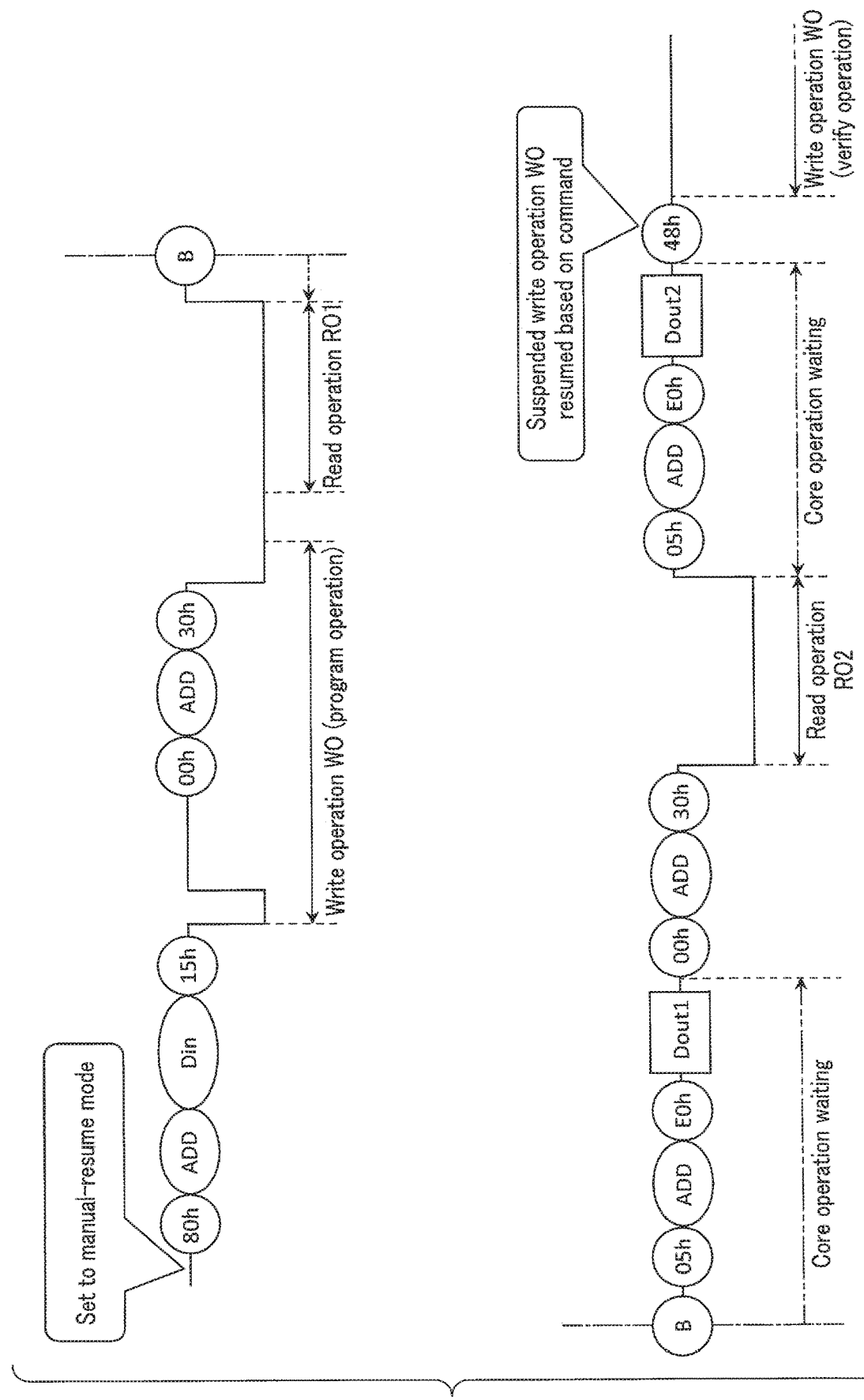
FIG. 6B illustrates another example of a timing chart showing command sequences and a ready/busy signal relating to a suspend read operation performed in the semiconductor memory device according to the first embodiment.

FIG. 6B illustrates an example of a timing chart showing command sequences and a ready/busy signal R/Bn relating to two suspend read operations performed in the semiconductor memory device 1 according to the first embodiment. In the example of FIG. 6B, the semiconductor memory device 1 is set to the manual-resume mode.

The command sequences and the ready/busy signal R/Bn from the start of the write operation WO, followed by the suspension of the ongoing write operation WO, to the start of the read operation RO1 are the same those described with reference to FIG. 6A.

After completion of the read operation RO1, the sequencer 17 causes the ready/busy controller 18 to transmit the ready/busy signal R/Bn to the memory controller 2 at the H level. Thereby, the memory controller 2 is notified that the semiconductor memory device 1 is in the ready state. The memory controller 2 issues a command "05h", address information ADD, and a command "E0h", and transmits them to the semiconductor memory device 1. In response to receipt of the command "E0h", the sequencer 17 causes the data Dout1 read through the read operation RO1 to be output to the memory controller 2.

Unlike the semiconductor memory device 1 set to the auto-resume mode described with reference to FIG. 6A, the semiconductor memory device 1 set to the manual-resume mode does not automatically resume the write operation WO in accordance with the completion of the read operation RO1. Instead, in accordance with the completion of the operation to transfer each bit of the data Dout1 from the memory cell array 11 to the corresponding latch circuit XDL, namely, in accordance with the completion of the read operation RO1, the semiconductor memory device 1 causes an operation to access the memory cell array 11 (referred to as a "core operation" in FIG. 6E) to Wait until a command to trigger the access is received. In the example of FIG. 6B, the memory controller 2 issues, after the output of the data Dout1 to the memory controller 2, a command "00h", address information ADD, and a command "30h" again, and transmits them to the semiconductor memory device 1. In response to receipt of the command "30h", the sequencer causes the ready/busy controller 18 to transmit the ready/busy signal R/Bn to the memory controller 2 at the L level. Thereby, the memory controller 2 is notified that the semiconductor memory device 1 is in the busy state. The sequencer 17 starts a read operation RO2.

After completion of the read operation RO2, the sequencer 17 causes the ready/busy controller 18 to transmit the ready/busy signal R/Bn to the memory controller 2 at the H level. Thereby, the memory controller 2 is notified that the semiconductor memory device 1 is in the ready state. In accordance with the completion of the read operation RO2, the semiconductor memory device 1 causes the operation to access the memory cell array 11 to wait until a command to trigger the access is received. The memory controller 2 issues command "05h", address information ADD, and a command "E0h", and transmits them to the semiconductor memory device 1. In response to receipt of the command "E0h", the sequencer 17 causes the data Dout2 read through the read operation RO2 to be output to the memory controller 2.

Thereafter, the memory controller 2 issues a command "48h", and transmits it to the semiconductor memory device 1. The command "48h" is a command used to instruct the semiconductor memory device 1 to resume the suspended write operation WO. In response to receipt of the command "48h", the sequencer 17 resumes the suspended write operation WO. In the resumed write operation WO, for example, a verify operation for the previously-completed program operation is performed.

A case has been described above, as an example, where two read operations are performed in succession during the suspension of the write operation, in the semiconductor memory device 1 set to the manual-resume mode. However, the operation of the semiconductor memory device 1 set to the manual-resume mode is not limited thereto, and the semiconductor memory device 1 may perform any number of read operations in succession, during suspension of the write operation.

In this manner, the semiconductor memory device 1 set to the manual-resume mode does not automatically resume the suspended write operation in accordance with the completion of the suspend read operation, but causes an operation to access the memory cell array 11 to wait, in accordance with the completion of the suspend read operation. Thereafter, the semiconductor memory device is capable of manually resuming the suspended write operation. The semiconductor memory device 1 set to the manual-resume mode capable of performing another suspend read operation during the period from the completion of the suspend read operation until the manual resumption of the suspended write operation, as described above.

Figure 7A:
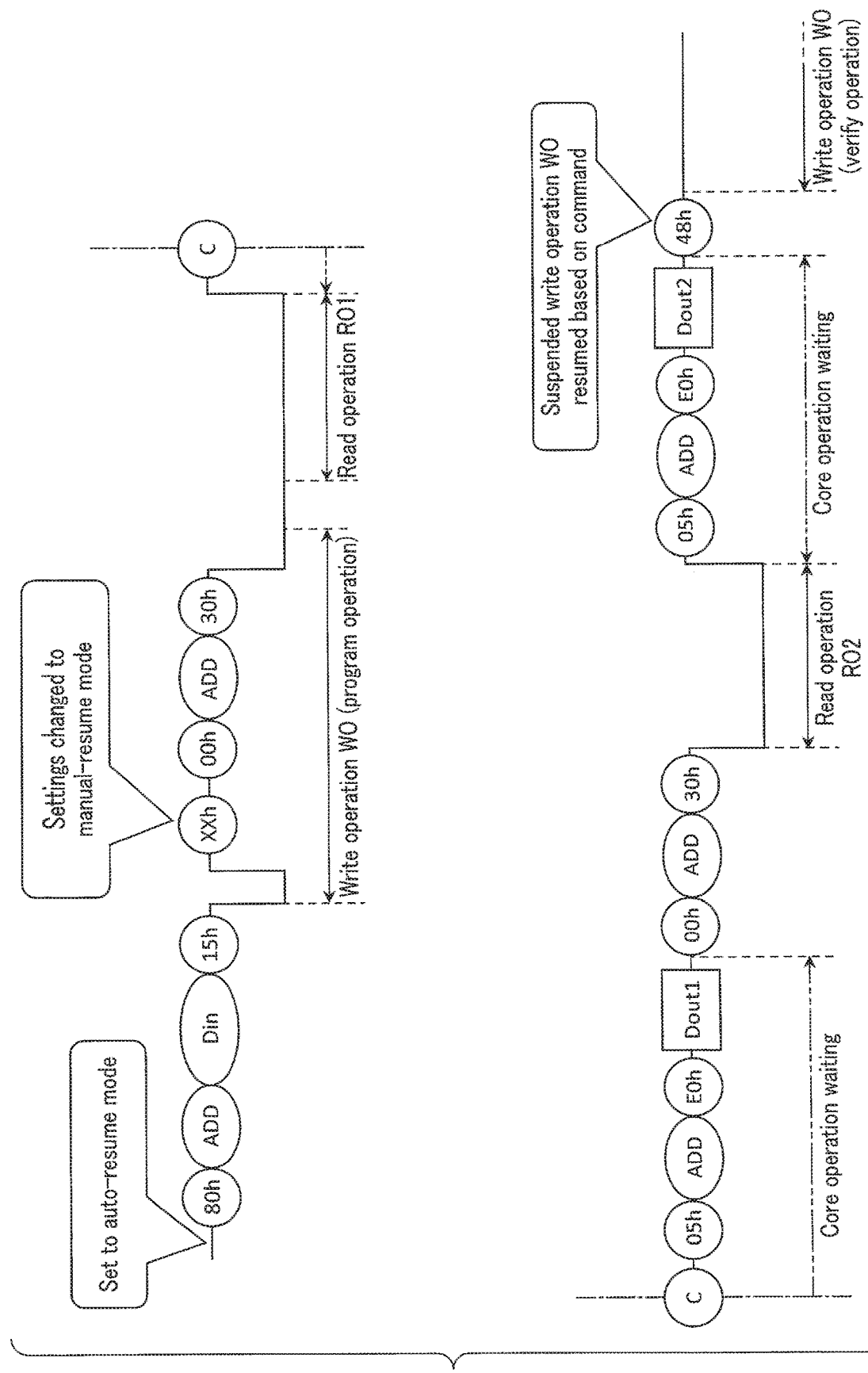
FIG. 7A illustrates another example of a timing chart showing command sequences and a ready/busy relating to a suspend read operation performed in the semiconductor memory device according to the first embodiment.

(3) Operation Example with Change in Settings from Auto-Resume Mode to Manual-Resume Mode FIG. 7A illustrates another example of a timing chart showing command sequences and a ready/busy signal R/Bn relating to two suspend read operations performed in the semiconductor memory device 1 according to the first embodiment. In the example of FIG. 7A, the semiconductor memory device 1 is set in advance to the auto-resume mode, as in the example of FIG. 6A.

The command sequences and the ready/busy signal R/Bn up to the start of the write operation WO are the same as those described with reference to FIG. 6A.

While the write operation WO is being performed, the memory controller 2 issues a command "XXh", and transmits it to the semiconductor memory device 1. The command "XXh" is a command used to change the settings of the semiconductor memory device 1 between the auto-resume mode and the manual-resume mode. For example, in response to receipt of the command "XXh", the sequencer 17 changes the settings of the semiconductor memory device 1 from the auto-resume mode to the manual-resume mode.

Subsequently, the memory controller 2 issues command "00h", address information ADD, and a command "30h", and transmits them to the semiconductor memory device 1. Thereby, the sequencer 17 causes the ongoing write operation WO to be suspended at the timing at which, for example, a program operation has been completed, and thereafter starts a read operation. The command sequences and the ready/busy signal R/Bn subsequent to this operation are the same as those of the operation of the semiconductor memory device 1 set to the manual-resume mode, described with reference to FIG. 6B.

The timing at which the semiconductor memory device 1 receives the command "XXh" is not limited to the above-described timing. The command "XXh" is, for example, command that can be accepted even when the semiconductor memory device 1 is in the busy state. When, for example, the semiconductor memory device 1 receives a command "XXh" at least by the start of the output of the data Dout1, the semiconductor memory device 1 may manually resume the suspended write operation WO from the completion of the read operation RO1, instead of automatically resuming the suspended write operation WO in accordance with the completion of the read operation RO1, as described with reference to FIG. 6B.

Figure 7B:
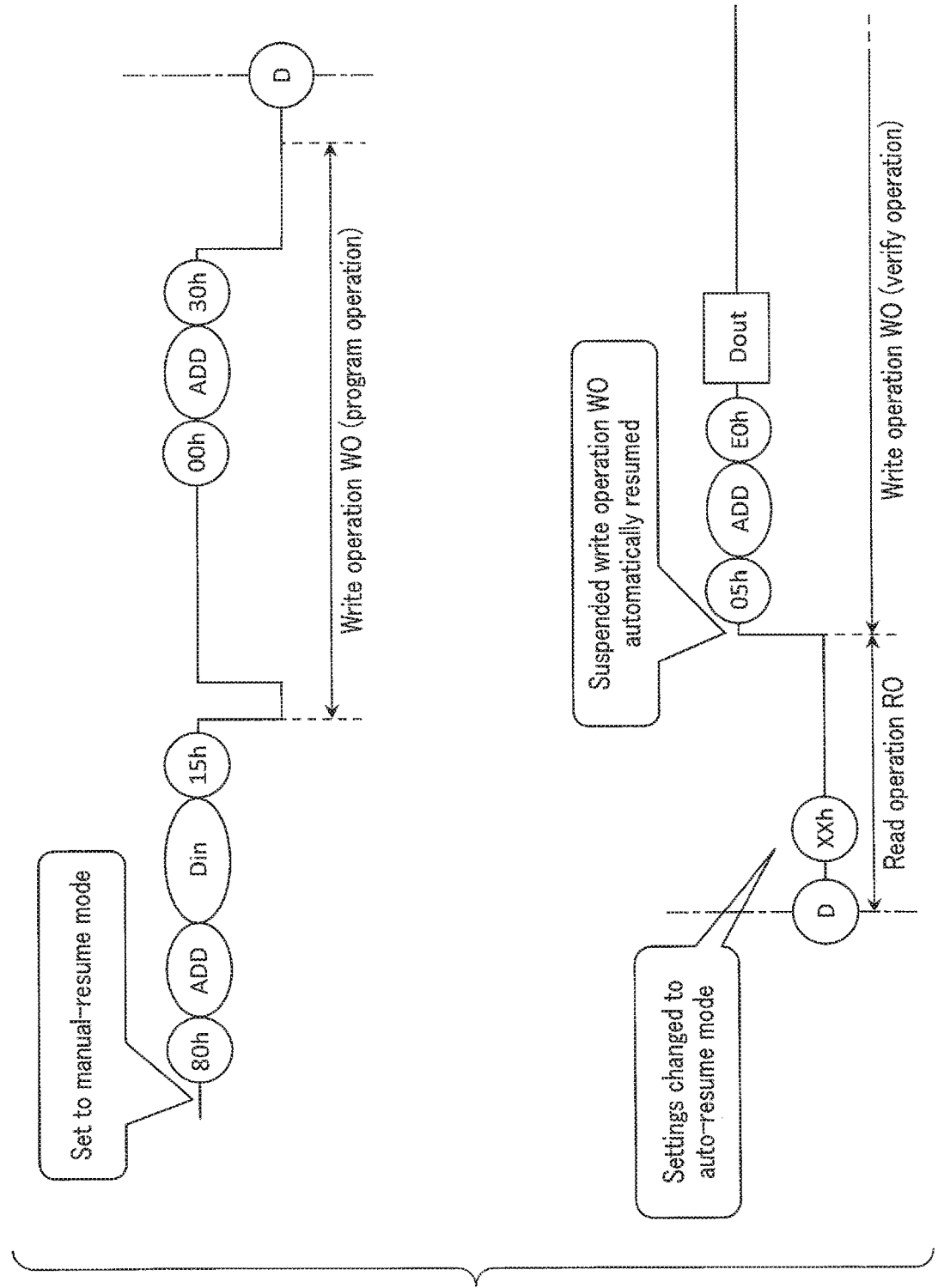
FIG. 7B illustrates another example of a timing chart showing command sequences and a ready/busy signal relating to a suspend read operation performed in the semiconductor memory device according to the first embodiment.

(4) Operation Example with Change in Settings from Manual-Resume Mode to Auto-Resume Mode FIG. 7B illustrates another example of a timing chart showing command sequences and a ready/busy signal R/Bn relating to a suspend read operation performed in the semiconductor memory device 1 according to the first embodiment. In the example of FIG. 7B, the semiconductor memory device 1 is set in advance to the manual-resume mode, as in the example of FIG. 6B.

The command sequences and the ready/busy signal R/Bn from the start of the write operation WO, followed by the suspension of the ongoing write operation WO, to the start of the read operation RO are the same as those described with reference to FIG. 6B.

While the read operation RO is being performed, the memory controller 2 issues a command "XXh", and transmits it to the semiconductor memory device 1. For example, in response to receipt of the command "XXh", the sequencer 17 changes the settings of the semiconductor memory device 1 from the manual-resume mode to the auto-resume mode. The command sequences and the ready/busy signal R/Bn subsequent to the completion of the read operation RO are the same as those of the operation of the semiconductor memory device 1 set to the auto-resume mode, described with reference to FIG. 6A.

The timing at which the semiconductor memory device 1 receives the command "XXh" is not limited to the above-described timing. When, for example, the semiconductor memory device 1 receives a command "XXh" by the start of the output of the data Dout read through the read operation RO, the semiconductor memory device 1 automatically resumes the suspended write operation WO in response to the completion of the read operation RO, as described with reference to FIG. 6A.

A case has been described as an example where the settings of the semiconductor memory device 1 are changed one time in response to the command "XXh", with reference to FIGS. 7A and 7E; however, the present embodiment is not limited thereto. The semiconductor memory device 1 may be configured to receive the command "XXh" multiple times, and change the settings between the auto-resume mode and the manual-resume mode upon every receipt of the command "XXh".

A case has been described above where a command such as the command "XXh" is used to change the settings of the semiconductor memory device 1; however, the present embodiment is not limited thereto. The change of the settings of the semiconductor memory device 1 may be implemented by, for example, changing the parameters that define various operations of the semiconductor memory device 1 through the use of, for example, a Set Features command.

A case has been described above, as an example, where the semiconductor memory device 1 operates with a change in settings between the auto-resume mode and the manual-resume mode; however, the present embodiment is not limited thereto. For example, regarding resumption of the suspended write operation, the semiconductor memory device 1 may be set to a mode other than the auto-resume mode and the manual-resume mode. In this case, the semiconductor memory device 1 may be configured, for example, to operate with a change in settings from one of such modes to another mode.

A case has been described above, as an example, where the semiconductor memory device 1 suspends a write operation at the timing at which a program operation is completed, and, after the completion of the suspend read operation, resumes the write operation from a verify operation that follows the program operation. However, the present embodiment is not limited thereto.

The semiconductor memory device 1 may be configured to suspend an ongoing write operation while a program operation is being performed, and to resume, after completion of the suspend read operation, the write operation from the beginning of the program operation. The semiconductor memory device 1 may be configured to suspend an ongoing write operation while a program operation is being performed, and to resume, after completion of the suspend read operation, the suspended write operation from where the program operation left off. The semiconductor memory device 1 may be configured to suspend an ongoing write operation while a program operation is being performed, and to resume, after completion of the suspend read operation, the suspended write operation from a verify operation for the program operation. In these cases and the cases shown in FIGS. 6A to 7B, the semiconductor memory device 1 receives, for example, a command "30h" while a program operation, that is performed immediately before the suspension, is being performed.

Alternatively, the semiconductor memory device 1 may be configured to suspend a write operation at the timing at which a verify operation is completed, and, after completion of a suspend read operation, resume the write operation from a program operation that follows the verify operation. The semiconductor memory device 1 may be configured to suspend an ongoing write operation while a verify operation is being performed, and to resume, after completion of the suspend read operation, the write operation from where the verify operation is left off. In these cases, the semiconductor memory device 1 receives, for example, a command "30h" while the verify operation, that is performed immediately before the suspension, is being performed.

Advantageous Effects

As described with reference to FIG. 6A, the semiconductor memory device 1 set to the auto-resume mode throughout the processing automatically resumes the suspended write operation WO, in accordance with the completion of the suspend read operation RO. The semiconductor memory device 1 performs the resumed write operation, for example, in parallel with the output of the data Dout. As described with reference to FIG. 6B, the semiconductor memory device 1 set to the manual-resume mode throughout the processing causes an operation to access the memory cell array 11 to wait, in accordance with the completion of the suspend read operation RO. Thereafter, the semiconductor memory device 1 outputs the data Dout to the memory controller 2, and then resumes the suspended write operation WO in response to receipt of the command "48h".

If a subsequent suspend read operation does not exist after completion of a suspend read operation, it is desirable that the write operation be resumed promptly. In such a case, it is desirable that the semiconductor memory device 1 be set to the auto-resume mode, rather than the manual-resume mode. On the other hand, if a subsequent suspend read operation exists after completion of a suspend read operation, it is desirable that the write operation not be resumed, and that the subsequent suspend read operation be performed promptly. In such a case, it is desirable that the semiconductor memory device 1 be set to the manual-resume mode, in which the suspend read operations RO1 and RO2 can be performed in succession before the receipt of the command "48h", rather than the auto-resume mode.

The semiconductor memory device 1 according to the first embodiment is capable of changing the settings between the auto-resume mode and the manual-resume mode, in response to the command "XXh". Accordingly, when, for example, multiple suspend read operations are performed in the semiconductor memory device 1, the settings of the semiconductor memory device 1 may be suitably changed to enable operation in the manual-resume mode. It is thereby possible to allow the semiconductor memory device 1 to perform multiple suspend read operations in succession, without resuming the write operation. When, for example, only a single suspend read operation is performed in the semiconductor memory device 1, or it can be known that the suspend read operation being performed by the semiconductor memory device 1 is the last suspend read operation, the settings of the semiconductor memory device 1 may be suitably changed to enable operation in the auto-resume mode. It is thereby possible to resume the write operation promptly after completion of the suspend read operation.

OTHER EMBODIMENTS

If the specification uses terms such as "same", "equal", "constant", and "maintain", variations within the design range may be tolerated.

Also, the term "applying" or "supplying" of a voltage means both performing control to apply or supply the voltage, and actually applying or supplying the voltage.

In addition, applying or supplying of a voltage may include, for example, applying or supplying a voltage of 0V.

In the specification of the present application, the term "couple" refers to electrical coupling, and does not exclude intervention of another component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
an input/output circuit;
a memory cell array including a plurality of memory cells;
a sense amplifier module having a sense amplifier circuit and a latch circuit; and
a control circuit configured to:
start a write operation on the memory cell array in response to a first command set,
the write operation including:
a program operation which increases a threshold voltage of one of the memory cells, and
a verify operation which verifies whether the threshold voltage of the one of the memory cells has exceeded a predetermined voltage,
the first command set including a first command, a first address, first data, and a second command,
wherein:
the control circuit is configured to, upon receipt of a second command set while performing the write operation in a first mode:
suspend the write operation;
start a read operation on the memory cell array; and
upon completion of the read operation, resume the suspended write operation;
the second command set including a third command, a second address, and a fourth command,
the control circuit is further configured to, upon receipt of the second command set while performing the write operation in a second mode:
suspend the write operation;
start the read operation on the memory cell array; and
upon receipt of a fifth command after the read operation is completed, resume the suspended write operation,
the control circuit switches between the first mode and the second mode upon receipt of a sixth command,
the read operation reads second data out from the memory cell array via the sense amplifier circuit and stores the second data into the latch circuit,
the control circuit, upon receipt of a third command set, starts a data output operation in which the second data stored at the latch circuit are output to an outside of the semiconductor memory device via the input/output circuit,
the third command set includes a seventh command, the second address, and an eighth command,
the control circuit, after receipt of the second command set while performing the write operation in the second mode:
upon receipt of the third command set after the read operation is completed, starts the data output operation, and
upon receipt of the fifth command after the data output operation is completed, resumes the suspended write operation,
when the suspended write operation is not resumed in response to receipt of the fifth command, the controller resumes the suspended write operation in accordance with completion of the read operation, and
the control circuit is further configured to:
resume, when the suspended write operation is resumed in response to receipt of the fifth command, the suspended write operation after the output of the second data is completed; and
resume, when the suspended write operation is not resumed in response to receipt of the fifth command, the suspended write operation before the output of the second data is completed.

2. The device according to claim 1, wherein:
the control circuit, upon receipt of the sixth command while performing the write operation in the first mode, switches from the first mode to the second mode and suspends the write operation.

3. The device according to claim 1, wherein:
the control circuit is configured to receive the sixth command after the write operation is started.

4. The device according to claim 1, wherein:
when the suspended write operation is not resumed in response to receipt of the fifth command, the controller resumes the suspended write operation in accordance with completion of the read operation.

5. The device according to claim 1, wherein:
the control circuit, after receipt of the second command set while performing the write operation in the first mode:
upon completion of the read operation, resumes the suspended write operation, and
upon receipt of the third command set after completion of the read operation, outputs the second data to the outside of the semiconductor memory device while the resumed write operation is being performed.

6. The device according to claim 1, wherein:
when the suspended write operation is resumed in response to receipt of the fifth command, the controller resumes the suspended write operation after the output of the second data is completed.

7. The device according to claim 1, wherein the control circuit is configured to, after receipt of the second command set while performing the write operation in the second mode:
upon receipt of the second command set after completion of the data output operation, start a second read operation;
upon receipt of the third command set after the second read operation is completed, start a second data output operation; and
upon receipt of the fifth command after the second data output operation is completed, resume the suspended write operation.

8. The device according to claim 7, wherein:
the control circuit is further configured to, after receipt of the second command set while performing the write operation in the second mode:
upon receipt of the second command set after completion of the second data output operation, start a third read operation;
upon receipt of the third command set after the third read operation is completed, start a third data output operation; and
upon receipt of the fifth command after the third data output operation is completed, resume the suspended write operation.

9. The device according to claim 7, wherein:
the control circuit is configured to, after receipt of the second command set while the write operation is being performed under the second mode:
upon receipt of the second command set after completion of the second data output operation, start a third read operation;
upon receipt of the third command set after the third read operation is completed, start a third data output operation; and
upon receipt of the fifth command after the third data output operation is completed, resume the suspended write operation.

10. The device according to claim 1, wherein:
the sixth command is a specific command for switching between the first mode and the second mode.

11. A semiconductor memory device comprising:
an input/output circuit;
a memory cell array including a plurality of memory cells;
a sense amplifier module having a sense amplifier circuit and a latch circuit; and
a control circuit configured to:
start a write operation on the memory cell array in response to a first command set, the first command set including a first command, a first address, first data and a second command, the write operation including a program operation which increases a threshold voltage of one of the memory cells and a verify operation which verifies whether the threshold voltage of the one of the memory cells has exceeded a predetermined voltage,
start a read operation on the memory cell array in response to a second command set, the second command set including a third command, a second address and a fourth command, wherein in the read operation, second data is read out from the memory cell array by the sense amplifier circuit and thereafter stored into the latch circuit,
start a data output operation in response to a third command set, the third command set including a fifth command, the second address and a sixth command, wherein in the data output operation, the second data stored at the latch circuit is output to an outside of the semiconductor memory device via the input/output circuit,
wherein:
the control circuit switches between a first mode and a second mode upon receipt of a seventh command,
the control circuit is further configured to:
upon receipt of the seventh command while performing the write operation in the first mode, switch from the first mode into the second mode;
upon receipt of the second command set while performing the write operation in the second mode, suspend the write operation;
start the read operation on the memory cell array;
upon receipt of the third command set after the read operation is completed, start the data output operation, and
upon receipt of an eighth command after the read operation is completed, resume the suspended write operation,
the control circuit is further configured to:
upon receipt of the second command set while performing the write operation in the first mode, suspend the write operation;
start the read operation on the memory cell array;
upon receipt of the seventh command while performing the read operation, switch from the second mode into the first mode;
upon completion of the read operation, resume the suspended write operation; and
upon receipt of the third command set after completion of the read operation, output the second data to an outside of the semiconductor memory device while performing the resumed write operation,
when the suspended write operation is not resumed in response to receipt of the eighth command, the controller resumes the suspended write operation in accordance with completion of the read operation, and
the control circuit is configured to:
resume, when the suspended write operation is resumed in response to receipt of the eighth command, the suspended write operation after the output of the second data is completed; and resume, when the suspended write operation is not resumed in response to receipt of the eighth command, the suspended write operation before the output of the second data is completed.

* * * * *